A method of erasing a memory block of a non-volatile memory, including setting a pulse width of erase pulses to an initial width, repeatedly applying erase pulses to the memory block until the memory block meets an erase metric or until a maximum number of erase pulses have been applied, gradually adjusting a pulse voltage magnitude of the erase pulses from an initial pulse voltage level to a maximum pulse voltage level, and reducing the width of the erase pulses to less than the initial width when the pulse voltage magnitude reaches an intermediate voltage level between the initial pulse voltage level and the maximum pulse voltage level. Thus, narrow pulses are applied at higher voltage levels to reduce the amount of over erasure of the memory block.

US 8,345,485 B2

(12) United States Patent
Choy et al.

(10) Patent No.: US 8,345,485 B2
(45) Date of Patent: Jan. 1, 2013

(54) ERASE RAMP PULSE WIDTH CONTROL FOR NON-VOLATILE MEMORY

(75) Inventors: Jon S. Choy, Austin, TX (US); Chen He, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/023,713

(22) Filed: Feb. 9, 2011

(65) Prior Publication Data

US 2012/0201082 A1    Aug. 9, 2012

(51) Int. Cl.
*G11C 16/04* (2006.01)
(52) U.S. Cl. ......... 365/185.19; 365/185.02; 365/185.29; 365/185.3
(58) Field of Classification Search ............. 365/185.19, 365/185.29, 185.3, 185.02
See application file for complete search history.

(56) References Cited

U.S. PATENT DOCUMENTS

| | | | |
|---|---|---|---|
| 5,200,920 A | | 4/1993 | Norman et al. |
| 5,422,846 A | * | 6/1995 | Chang et al. ............. 365/185.12 |
| 5,801,987 A | * | 9/1998 | Dinh ........................ 365/185.18 |
| 5,917,757 A | | 6/1999 | Lee et al. |
| 5,991,201 A | | 11/1999 | Kuo et al. |
| 6,091,643 A | * | 7/2000 | Kawakami ............... 365/185.29 |
| 6,188,609 B1 | | 2/2001 | Sunkavalli et al. |
| 6,222,770 B1 | | 4/2001 | Roohparvar |
| 6,515,909 B1 | | 2/2003 | Wooldridge |
| 6,781,882 B2 | * | 8/2004 | Shimizu et al. .......... 365/185.19 |
| 7,079,424 B1 | | 7/2006 | Lee et al. |
| 7,236,405 B2 | * | 6/2007 | Ueda ........................ 365/185.29 |
| 7,957,190 B2 | * | 6/2011 | Hong et al. ............... 365/185.11 |
| 2004/0057288 A1 | | 3/2004 | Kawabata |
| 2009/0147572 A1 | | 6/2009 | Aritome |

FOREIGN PATENT DOCUMENTS

JP         11039887 A      2/1999

OTHER PUBLICATIONS

EP Application 12154251.8-1233, International Search Report and Written Opinion, dated Oct. 1, 2012.

* cited by examiner

*Primary Examiner* — Pho M Luu
(74) *Attorney, Agent, or Firm* — Gary Stanford (57) ABSTRACT

20 Claims, 4 Drawing Sheets

ERASE RAMP PULSE WIDTH CONTROL FOR NON-VOLATILE MEMORY

BACKGROUND OF THE INVENTION

1. Field of the Invention

The present invention relates in general to non-volatile memories, and more specifically to a system and method for erasing a non-volatile memory using erase ramp pulse width control to reduce erase threshold voltage distribution compression time and hence improve the total erase operation time.

2. Description of the Related Art

During a typical erase operation of a non-volatile memory (NVM) block, such as electrically erasable programmable read only memories (EPROMs), electrically erasable programmable read only memories (EEPROMs), block erasable EEPROMs (e.g., "Flash" memories), etc., a preprogram procedure is performed to raise the threshold voltages of the memory cells of the memory block to a level at or above a program verify voltage. For the erase operation, the preprogram procedure is followed by a Fowler-Nordheim (FN) erase procedure to lower the threshold voltages of the memory cells of the memory block to a level at or below an erase verify voltage. During the conventional FN erase procedure, however, the resulting distribution may include memory cells which have been over erased, which results in increased column leakage. Furthermore, the problem of column leakage increases as the memory cells are further scaled, causing, for example, a subsequent program operation to fail due to lowered drain bias, or a read operation to fail since the over-erased memory cells may prevent sense amplifiers from distinguishing between an erased cell and a programmed cell. A soft program procedure may be used after the FN erase procedure to compress the distribution of the erased cells so as to reduce the column leakage.

As the technology and feature size of the memory cells become smaller, the total erase operation time has become dominated by the soft programming procedure. In many cases the soft programming has become excessive which resulted in excessive erase time.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
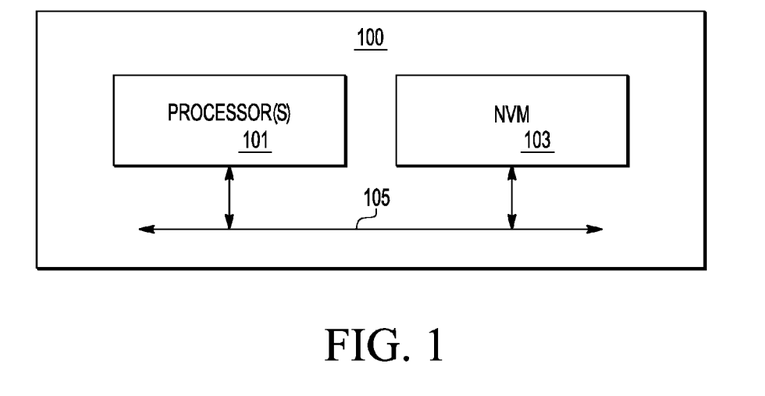
FIG. 1 is a block diagram of an integrated circuit including a non-volatile memory (NVM) according to one embodiment.

FIG. 1 is a block diagram of an integrated circuit 100 including a non-volatile memory (NVM) 103 according to one embodiment. In the illustrated embodiment, the integrated circuit (IC) 100 may implement a system on a chip (SOC) or the like which includes at least one processor 101 coupled to the NVM 103 via an appropriate interface 105, such as a bus or the like with multiple signals or bits. The IC 100 may include other circuits, modules or devices, such as other memory devices (not shown), other functionally modules (not shown), and external interfaces, such as input, output or input/output (I/O) ports or pins or the like (not shown). In one alternative embodiment, the NVM 103 is integrated on the IC 100 alone without any other devices. In another alternative embodiment, the processor 101, NVM 103 and interface 105 are part of a larger system on the IC 100.

Figure 2:
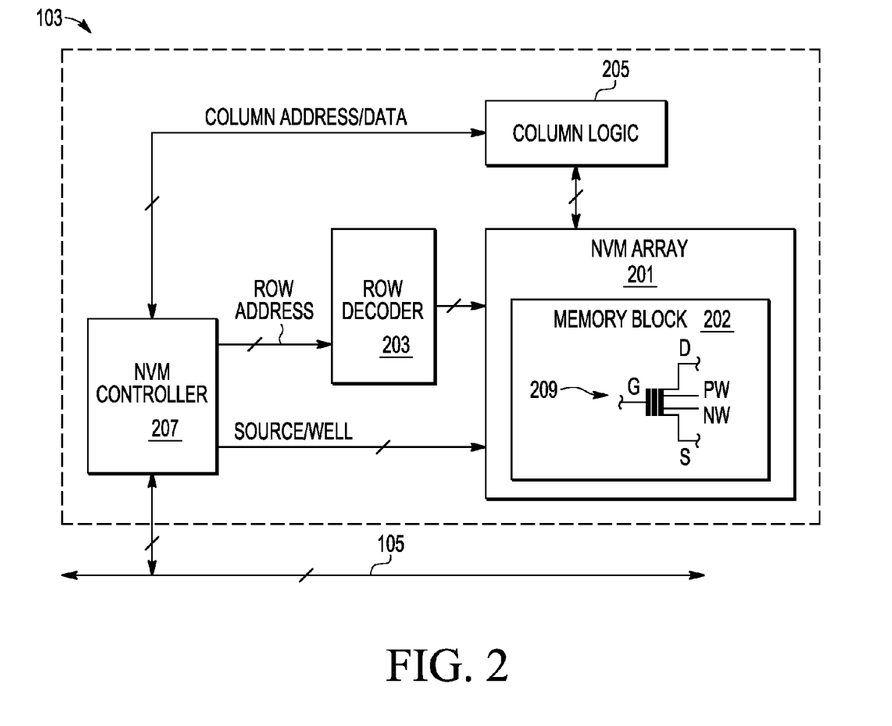
FIG. 2 is a more detailed block diagram of the NVM according to one embodiment coupled to the interface of FIG. 1.

FIG. 2 is a more detailed block diagram of the NVM 103 according to one embodiment coupled to the interface 105. The NVM 103 includes an NVM array 201, a row decoder 203 coupled to the NVM array 201, column logic 205 coupled to the NVM array 201, and a memory controller 207 coupled to the interface 105, the column logic 205, and the row decoder 203. The column logic 205 incorporates a column decoder and sense amplifiers (not shown) and each interface is shown with multiple signals or bits. The memory controller 207 controls operation of the NVM array 201 through the row decoder 203 and the column logic 205, such as in response to the processor(s) 101 as communicated through the interface 105 or other interfaces. The memory controller 207 accesses memory cells within the NVM array 201 by providing a row address to the row decoder 203 and a column address to the column logic 205. Data is written into or read from the NVM array 201 via the column logic 205. The memory controller 207 also drives source and well voltages (via corresponding switches and controllers, not shown) to the NVM array 201. The NVM array 201 incorporates one or more blocks of memory cells in which each memory block has a selected block size, such as, for example, 16 kilobytes (kB), 32 kB, 64 kB, 128 kB, 256 kB, etc. As shown, the NVM array 201 includes at least one memory block 202.

Shown within the memory block 202 of the NVM array 201 is an exemplary memory cell 209 having a gate (G) terminal, a drain (D) terminal and a source (S) terminal along with isolated wells including a pwell (PW) and an nwell (NW). In one embodiment, each memory block is organized into rows and columns of the memory cells 209. The gate terminal of each row of memory cells 209 is coupled to a corresponding one of multiple wordlines coupled to the row decoder 203. The drain terminal of each column of memory cells 209 is coupled to a corresponding one of multiple bit lines coupled to the column logic 205. The source terminal and wells (PW and NW) of each memory cell 209 are driven or controlled by the memory controller 207. In one embodiment, the memory controller 207 drives individual voltage levels to PW and NW.

The memory cells 209 are implemented according to any one of several configurations, such as semiconductor configurations, layered silicon-metal nano crystals, etc. In one embodiment, each memory cell 209 is implemented on a silicon substrate or the like. In one embodiment, the pwell of each memory cell 209 is isolated from a P substrate with the nwell. A pair of n+ type doped regions (not shown) are formed in the pwell forming the drain and source terminals of each memory cell 209. Each memory cell 209 further includes a stacked gate structure or the like, including an oxide layer (not shown) formed on the pwell, a floating gate (not shown) provided on the oxide layer, a dielectric layer (not shown) provided on the floating gate, and a control gate (not shown) provided on the dielectric layer forming a gate terminal. The pwell is generally coupled to a ground voltage Vss and the nwell is generally coupled to a source voltage Vdd except during FN erase pulses as described herein. The voltage level of Vdd depends upon the particular implementation. In one embodiment, Vdd is approximately 3.3 Volts (V).

In one embodiment, when an erase pulse is applied to the memory cell 209 during an erase operation as further described herein, the pwell and nwell of the memory cell 209 are coupled or otherwise driven together to collectively receive an erase ramp pulse voltage. As described herein, an "erase pulse" is said to be applied to each memory cell 209 of the memory block 202 in which the gate terminal is driven to a selected erase pulse voltage and in which the pwell and nwell collectively receive an erase ramp pulse voltage which successively increases until the memory block is erased. The magnitude of the erase ramp pulse voltage applied to pwell and nwell is incrementally increased or otherwise ramped higher with each application of an erase pulse to the memory cells until the memory block 202 is erased. Thus, each erase pulse applied to the memory cells includes an erase pulse voltage applied to the gate terminal and an erase ramp pulse voltage applied to at least one well connection of the memory cells.

The present disclosure is described using an exemplary NVM technology in which the erase ramp pulse voltage is applied to the pwells and nwells of the memory cells while the gate terminals receive an erase pulse voltage having a relatively fixed magnitude. In alternative embodiments, such as those using other NVM technologies and the like, the erase ramp pulse voltage is instead applied to a different connection or terminal of the memory cells being erased, such as the gate terminal or the like.

Figure 3:
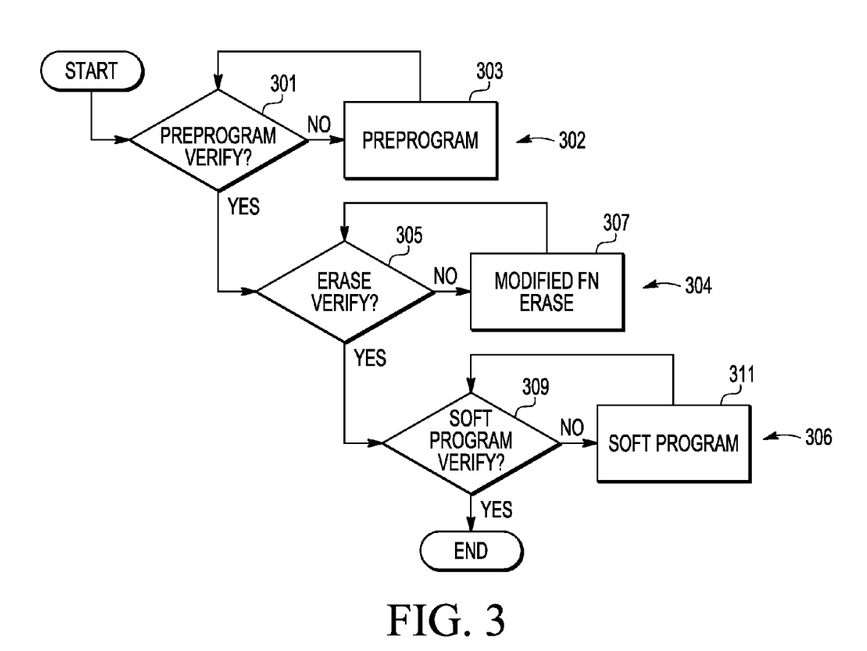
FIG. 3 is a simplified flowchart diagram of an erase operation generally controlled by the memory controller of FIG. 2 in accordance with one embodiment for the memory block within the NVM array of FIG. 2.
Figure 4:
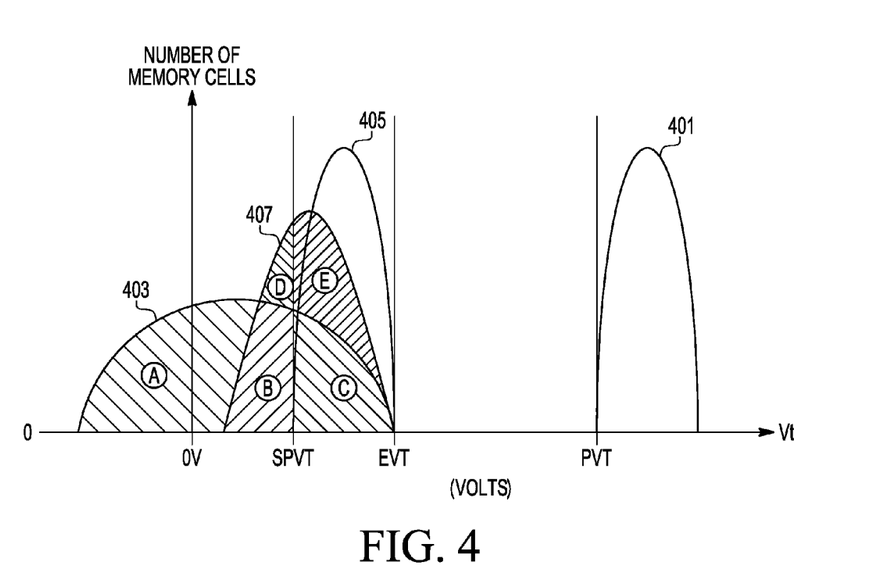
FIG. 4 is a graphic diagram illustrating threshold voltage (Vt) distributions of the memory cells of the memory block of FIG. 2 during the erase operation of FIG. 3 in accordance with one embodiment.

FIG. 3 is a simplified flowchart diagram of an erase operation generally controlled by the memory controller 207 in accordance with one embodiment for the memory block 202 within the NVM array 201. The erase operation includes three separate procedures, including a preprogram procedure 302, an erase procedure 304, and a soft program procedure 306. It is understood that the erase operation is performed on a per-block basis of the NVM array 201, such as the entire NVM array 201, or any selected one or more memory blocks thereof, although described herein as being applied to the memory block 202. FIG. 4 is a graphic diagram illustrating threshold voltage (Vt) distributions of the memory cells 209 of the memory block 202 during the erase operation of FIG. 3 in accordance with one embodiment. The graphic diagram of FIG. 4 plots the number of memory cells 209 on the vertical axis (generally using a logarithmic scale) versus Vt plotted along the horizontal axis. The erase operation is described with reference to both the flowchart diagram of FIG. 3 and the threshold voltage distributions of FIG. 4.

At first step 301, a preprogram verify test is performed for the memory block 202. Although programming and verification may be performed on individual memory cells, programming and verification is typically performed on a per-page basis in which each page includes a selected number of memory cells or bits, such as 128 bits or the like. A programming pulse may be applied to multiple cells or bits at a time, such as up to 9 bits. During the preprogram verify test, the Vt of one or more memory cells is compared with a program verify threshold (PVT) voltage. If Vt is below the PVT voltage, operation proceeds to step 303 to perform a preprogramming of one or more memory cells which have failed the preprogram verify test, in which a program pulse of a selected voltage level is applied to the memory cell(s) to increase Vt. Operation returns to step 301 to determine whether Vt of the memory cell(s) is above PVT, and operation loops between steps 301 and 303 by applying additional program pulses until Vt of each memory cell 209 of the memory block 202 is at least PVT. As shown in FIG. 4, curve 401 figuratively illustrates an exemplary Vt distribution of the memory block 202 after the preprogram procedure 302 is complete in which Vt of each memory cell is at or above the PVT voltage.

After the preprogram procedure 302 is completed, operation advances to step 305 of the erase procedure 304 in which an erase verify test is performed for the memory cells 209 of the memory block 202 to determine whether the memory block 202 meets an erase metric. During the erase verify test, the Vt of each of the memory cells 209 is compared with an erase verify threshold (EVT) voltage (representing the erase metric for each of the memory cells 209). If Vt of any memory cell 209 of the memory block 202 is above the EVT voltage, operation proceeds to step 307 to perform a modified FN erase procedure of the entire memory block 202, in which one or more erase pulses of selected voltage levels and durations, as further described below, are applied to the memory block 202 to decrease Vt of the memory cells 209 within the memory block 202. Operation returns to step 305 to determine whether Vt of each memory cell 209 of the memory block 202 is at or below EVT, and operation loops between steps 305 and 307 by applying additional erase pulses until Vt of each memory cell 209 of the entire memory block 202 is at or below EVT. It is noted that even if a single memory cell 209 fails the erase verify test such that its threshold voltage Vt is above EVT, the entire memory block 202 receives another erase pulse until the Vt of every memory cell 209 is at or below EVT. In this manner, many of the memory cells 209 are "over erased" having a Vt well below EVT as further described herein.

As shown in FIG. 4, curve 403 figuratively illustrates an exemplary Vt distribution of the memory cells 209 of the memory block 202 after a conventional FN erase procedure is completed in which Vt of each memory cell 209 is at or below the EVT voltage. Curve 405 figuratively illustrates a desired Vt distribution of the memory cells 209 of the memory block 202 in which Vt is at or below EVT but also at or above a soft program verify threshold (SPVT) voltage. The Vt distribution of the memory cells 209 after a conventional FN erase procedure as shown by curve 403 is shown divided into three portions A, B and C. Portion A is bounded below by the horizontal zero line, above and at the left by curve 403 until it intersects curve 407, and then by curve 407 on the right down to the horizontal zero line. Portion B is bounded below by the horizontal zero line, to the left by curve 407 until it intersects curve 403, above by curve 403 between intersections between curve 403 and the vertical SPVT voltage line, and then by the vertical SPVT voltage line on the right down to the horizontal zero line. Portion C is bounded below by the horizontal zero line, to the left by the vertical SPVT voltage line up to curve 403, and then by curve 403 down to the horizontal zero line. The portions A and B collectively illustrate the number of memory cells 209 which have been over erased by the conventional FN erase procedure since having a threshold voltage Vt below the SPVT voltage, whereas portion C illustrates the number of memory cells 209 which fall within the desired voltage range between SPVT and EVT inclusive.

Curve 407 figuratively illustrates an exemplary Vt distribution of the memory cells 209 of the memory block 202 after the modified FN erase procedure is completed in accordance with an embodiment in which Vt of each memory cell 209 is at or below the EVT voltage. The Vt distribution of the memory cells 209 after the modified FN erase procedure as shown by curve 407 is shown divided into four portions B, C, D and E. Portions B and C are the same portions under curve 403 in which the memory cells 209 within portion B have a threshold voltage Vt below the SPVT voltage and the memory cells 209 within portion C have a threshold voltage Vt at or above the SPVT voltage. Portion D is bounded by the triangular shaped area above curve 403, below curve 407 and to the left of the vertical SPVT voltage line. Portion E is bounded by the triangular-shaped area above curve 403, below curve 407 and to the right of the vertical SPVT voltage line. Portion A of curve 403 as a result of the conventional FN erase procedure is replaced by portions D and E, in which the memory cells 209 within portion D have a threshold voltage Vt below the SPVT voltage and the memory cells 209 within portion E have a threshold voltage Vt at or above the SPVT voltage. In this manner, the modified FN erase procedure provides a significant improvement in that a substantial number of the memory cells 209 of the memory block 202 that are otherwise over erased by the conventional FN erase procedure instead fall within the desired Vt distribution range between the SPVT and EVT voltages. The improvement is realized during the soft program procedure 306 since only those memory cells 209 within portions B and D are soft programmed rather than all of the memory cells 209 within portions A and B. The time consumed during the soft program procedure 306 to compress the Vt distribution between SPVT and EVT is substantially reduced.

After the erase procedure 304 is completed, the soft program procedure 306 is initiated for the memory block 202 to place the Vt of the over erased memory cells 209 within the desired voltage range between SPVT and EVT. The soft program procedure 306 is typically performed on a per-page basis in which each page includes a selected number of memory cells 209, such as 128 cells or the like. A soft program pulse may be applied to multiple memory cells 209 at a time. In one embodiment, soft program pulses may be applied up to 36 memory cells 209 at a time. The soft program pulse is typically not as strong as a program pulse, such as having a lower voltage, a shorter pulse duration, or a combination of both. Operation proceeds to step 309 to perform a soft program verify test, in which the Vt of each of one or more of the memory cells 209 is compared with the SPVT voltage. If Vt is below the SPVT voltage, operation proceeds to step 311 to apply a soft program pulse to one or more of the memory cells 209 which fail the soft program verify test. The soft program pulse has a selected voltage level and duration to increase Vt above SPVT while remaining below EVT. Operation returns to step 309 to determine whether the Vt of any one of the memory cells 209 is below SPVT, and operation loops between steps 309 and 311 by applying additional soft program pulses until Vt of each memory cell 209 of the memory block 202 is between the SPVT and EVT voltages. The resulting compressed distribution curve after the soft program procedure 306 may appear similar to the desired distribution curve 405 in which the Vt of the memory cells 209 within the memory block 202 are between SPVT and EVT.

In an exemplary embodiment, during the preprogramming at step 303, the source terminal and pwell of one or more memory cell(s) 209 are set to Vss or 0V, nwell is set to 3.3 v, the drain terminal is set to about 4.2V, and the gate terminal is set to a relatively high positive voltage, such as about 8.5V. During the erase verify test at step 305, the gate terminal is set to about 3.5V, the drain terminal is set to about 0.5V, the source terminal is set to about 0V, pwell is set to about 0V and nwell is set to about 3.3V. During application of each erase pulse for the modified FN erase procedure at step 307, the source and drain terminals are left floating or set to a relatively high-Z impedance, the gate terminal is set to a relatively high negative pulse voltage, such as about −8.5V, and the pwell and nwell are tied together and to receive an erase ramp pulse voltage. During successive erase pulses applied to the memory cells 209 of the memory 202, the erase ramp pulse voltage applied to pwell and nwell ramps up in voltage from about 4.5V to about 8.5V as described herein for the modified FN erase procedure. During the soft program step 311, the source terminal and pwell are at 0V, nwell is set to 3.3V, the drain is at about 4.2V, and the gate terminal ramps from about 2.6V to about 3.4V. The particular voltage levels are exemplary only in which it is understood that other voltage levels are possible and contemplated in other embodiments.

Figure 5:
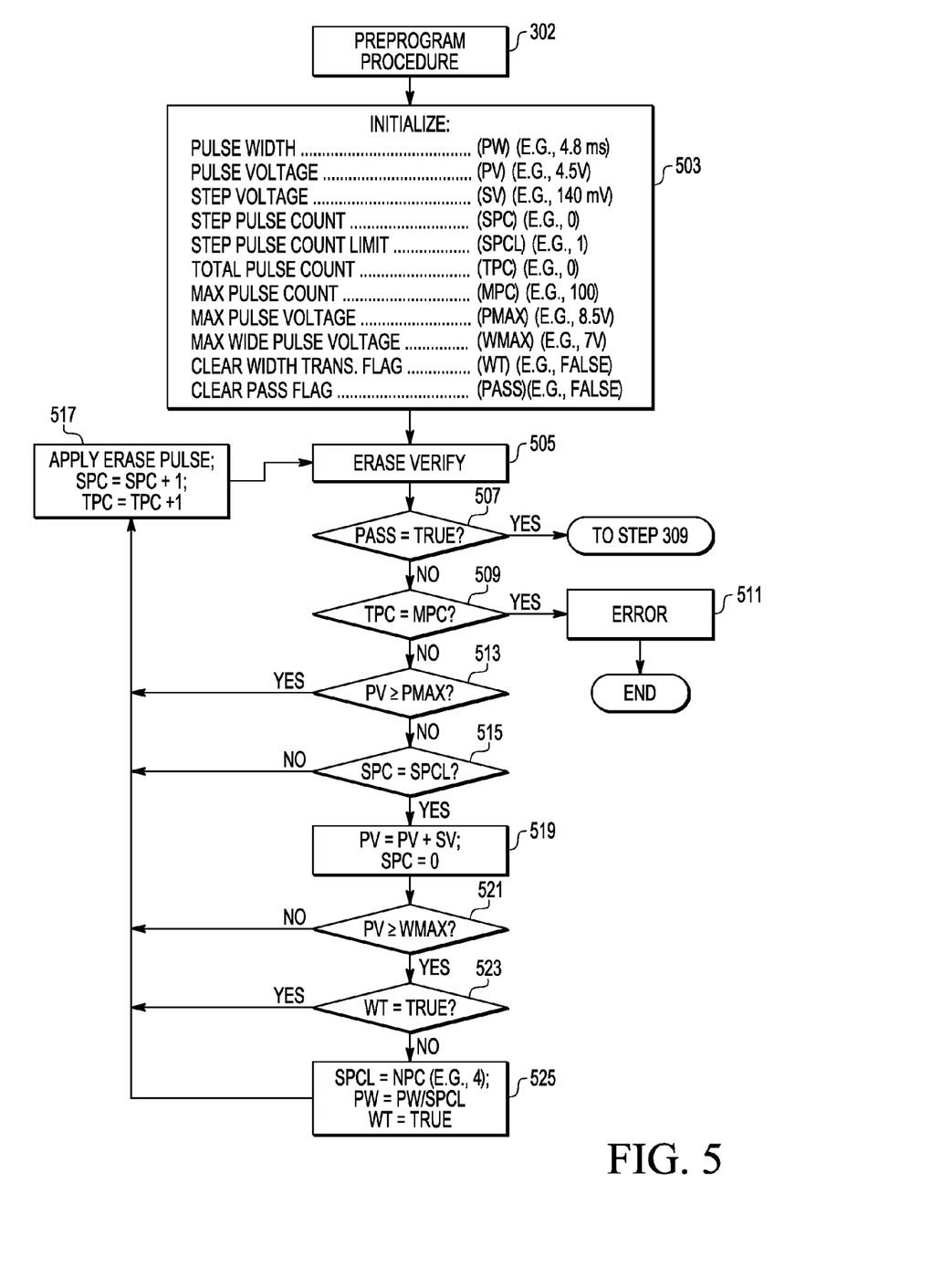
FIG. 5 is a more detailed flowchart diagram of the erase operation of FIG. 3 including the modified FN erase procedure according to one embodiment for the memory block(s) within the memory block of FIG. 2.

FIG. 5 is a more detailed flowchart diagram of the erase procedure 304 including the modified FN erase procedure according to one embodiment for the memory block 202 within the NVM array 201. The erase procedure 304 is performed on a block-basis and may include multiple memory blocks up to the entire NVM array 201, but is described herein as applying to the memory block 202. After the preprogram procedure 302, operation proceeds to an initialization step 503 in which several variables are initialized to control the erase procedure 304. An initial pulse width (PSW) value for the erase pulses is to an initial width or duration. In one embodiment, PSW is initially set to about 4.8 milliseconds (ms). A pulse voltage (PV) value is set to an initial erase ramp pulse voltage level to be applied to pwell and nwell of each memory cell 209 of the memory block 202. In one embodiment, PV is initially set to an initial voltage of about 4.5V. A step voltage (SV) value is set to an initial step voltage level to be added to the PV value after each iteration. In one embodiment, SV is initially set to about 140 millivolts (mV), and represents an incremental step voltage for gradually adjusting or increasing the erase pulse voltage as described herein. A step pulse count (SPC) value is initialized to zero (0), and a step pulse count limit (SPCL) value is initially set to one (1). The SPCL value determines the number of erase pulses applied at a given erase pulse voltage. When the SPCL value is one, then the voltage of each successive erase ramp pulse which is to be applied to pwell and nwell is increased by SV. When the SPCL value is greater than one, then the SPCL number of duplicate erase pulses are applied at the same erase pulse voltage in which the voltage of the erase ramp pulse is unmodified. A total pulse count (TPC) value is set to zero (0) and a maximum pulse count (MPC) value is set to a high pulse count number. In one embodiment, MPC is set to 100. A maximum pulse voltage value PMAX is set to a relatively high positive voltage level. In one embodiment, PMAX is initially set to about 8.5V. A maximum voltage value WMAX of the erase ramp pulse voltage for wide erase pulses is set to a predetermined intermediate voltage level. In one embodiment, WMAX is set to an intermediate voltage level of about 7V. A width transition (WT) flag is initially set false and used for identifying a switch from wider erase pulses to narrower erase pulses when PV reaches or otherwise exceeds the intermediate voltage level as further described herein. An erase verify PASS flag is initially set false. It is noted that the particular time and voltage values described herein are arbitrary and may be adjusted according to the particular implementation.

Figure 6:
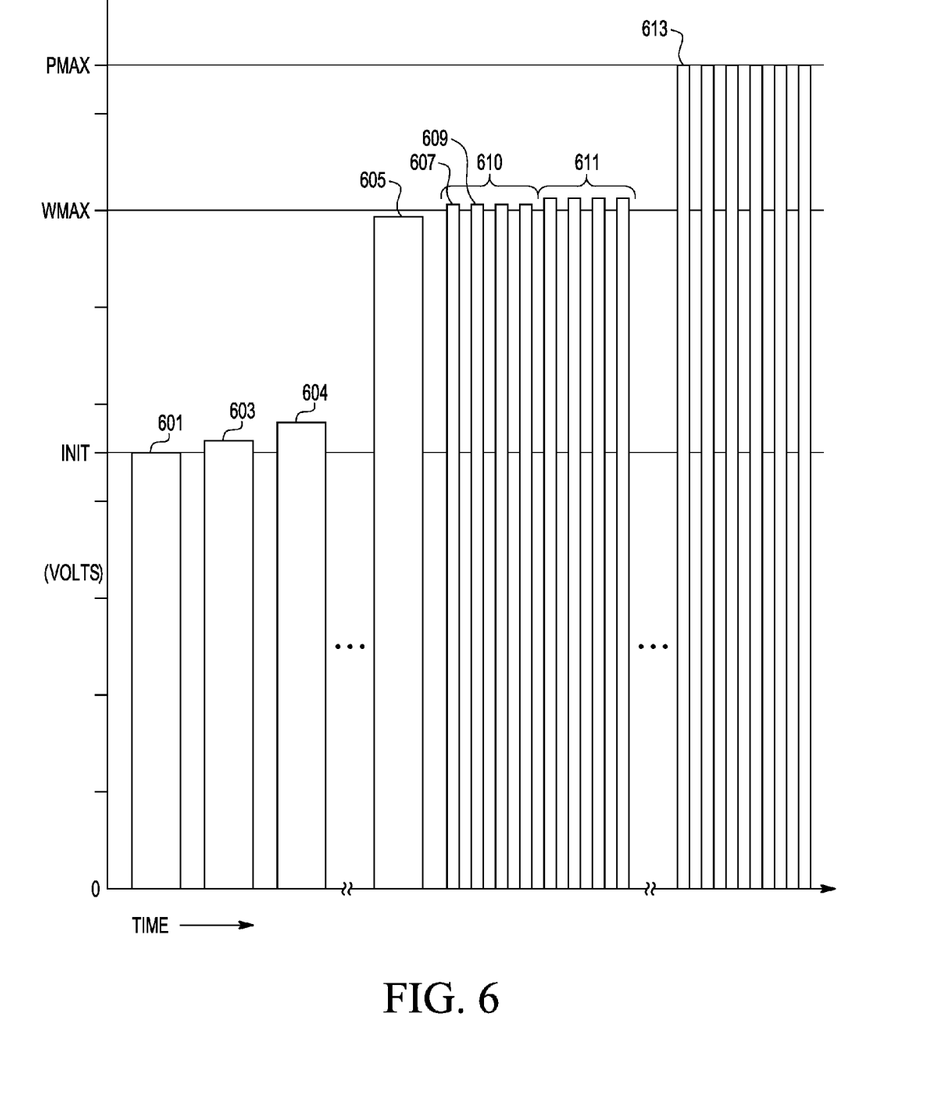
FIG. 6 is a timing diagram plotting the pwell voltage versus time during the erase procedure of FIG. 3 and according to the flowchart diagram of FIG. 5.

After initialization at step 503, operation proceeds to step 505 in which the erase verify test is performed for each of the memory cells 209 of the memory block 202 to determine whether any memory cell 209 has a Vt greater than the EVT voltage level. The erase verify test of steps 505 and 507 are the same as that described for step 305. If any memory cell 209 has a threshold voltage Vt greater than EVT, then the erase verify test fails and the PASS flag remains false. If none of the memory cells 209 have a threshold voltage Vt greater than EVT, then the test passes and the PASS flag is set to true. Operation then advances to step 507 to query whether PASS is true. If PASS is false, operation proceeds to block 509 to determine whether TPC=MPC. In the initial iteration, TPC is 0 and MPC is 100 so that TPC is not equal to MPC and operation advances to step 513. As further described below, TPC is incremented for each erase pulse applied to the memory block 202, and if the number of pulses reaches an excessive number represented by MPC, then the erase operation fails and operation advances instead to an error step 511 in which an error routine is performed and then the erase procedure 304 is completed. At step 513, it is queried whether PV≧PMAX representing that the pulse voltage has become greater than or equal to the maximum allowable pulse voltage. If not, operation advances to step 515 in which it is queried whether SPC=SPCL. In the first iteration, SPC is zero and SPCL is one, so that operation advances to step 517 in which an erase pulse is applied to the memory block 202. Each erase pulse applied to the memory cells 209 of the memory block 202 at step 517 is a combination of an erase voltage applied to the gate terminal and an erase ramp pulse voltage applied to pwell and nwell as previously described. The corresponding pwell voltage during the first erase pulse is shown at 601 (FIG. 6). Also, SPC and TPC are both incremented by one (SPC=SPC+1, TPC=TPC+1) at step 517, and operation returns to step 505 to one again perform the erase verify procedure.

Assuming PASS remains false, TPC is not equal to MPC, and PV is less than PMAX, operation advances to step 515 again. After the first erase pulse has been applied and SPC is incremented at step 517, then SPC=SPCL and operation advances to step 519 in which the pulse voltage value PV is increased by the step voltage value SV and SPC is reset back to 0. Operation then advances to step 521 in which it is queried whether PV≧WMAX. Assuming PV is initially 4.5V, SV is 140 mV and WMAX is 7V, then PV is increased to about 4.64V which is still less than WMAX. Thus, operation proceeds to step 517 in which a second erase pulse using an erase ramp pulse voltage at the new pulse voltage level (e.g., PV=4.64V) and the same pulse width (e.g., PSW=4.8 ms) is applied to the memory block 202. The corresponding pwell voltage during the second pulse is shown at 603. SPC is incremented to 1 again and TPC is incremented to 2 after the second erase pulse. Operation effectively loops between steps 505 and 521 via step 517 in which a series of erase pulses at the same relatively wide pulse width and incrementally increasing erase ramp pulse voltage level is applied to the memory cells 209 of the memory block 202 while repeatedly checking PASS at step 507 for each iteration. In one embodiment, assuming an initial value for PV of 4.5V and SV is about 140 mV, then the 17th erase pulse has an erase ramp pulse voltage of about 6.9V and PV is increased to just over 7V at step 519 so that PV becomes greater than WMAX. Operation then advances to step 523 in which it is queried whether WT is true. Since WT is initially false and has not yet been modified, operation proceeds to step 525 in which the SPCL value is increased to an integer NPC greater than one and the pulse width value PSW is decreased. In one embodiment, PSW is divided by SPCL (e.g., PSW=PSW/SPCL, where SPCL=NPC so that PSW=PSW/NPC). In one embodiment, NPC=4, although other values are contemplated as well. For NPC=4 and initial PSW of about 4.8 ms, then the new PSW is about 1.2 ms (PSW=4.8 ms/4=1.2 ms). Finally, the WT flag is set to true at step 525.

After step 525, operation loops back to step 517 and the next erase pulse (e.g., 18$^{th}$ erase pulse) is applied to the memory block 202 at about 7V. The erase pulse is narrower according to the new width value of PSW (e.g., 1.2 ms). The pwell voltage during the last wide erase pulse is shown at 605 and the pwell voltage of the first narrow erase pulse is shown at 607. SPC is incremented to 1 and TPC is incremented again (e.g., to 18) at step 517, and operation loops back to step 505 to perform another erase verify test. If PASS is still false, operation proceeds to step 515 in which it is determined that SPC does not yet equal SPCL since SPCL has been increased to NPC (e.g., 4). Thus, operation loops back to step 517 in which another narrow erase pulse of about 7V is applied to the memory block 202. Operation loops at step 515 until SPCL (e.g., 4) narrow pulses at WMAX (e.g., 7V) are applied and SPC becomes equal to SPCL at step 515. The pwell voltage during the first 4 duplicate narrow erase pulses is shown at 610. When SPC equals SPCL, then at step 519 the voltage of PV is again increased by SV (e.g., PV becomes about 7.16V) and since PV is greater than WMAX and WT is true, operation loops back to block 517 from step 523 to apply another narrow pulse. Operation loops for a second group of SPCL narrow pulses are applied at about the same voltage (e.g., 7.16V) assuming PASS remains false. The pwell voltage during the second 4 duplicate narrow erase pulses is shown at 611. Then the pulse voltage PV is increased again (e.g., to about 7.3V) at step 519 for up to another SPCL number of narrow erase pulses at the new voltage level. Assuming PASS remains false, operation continues in which SPCL narrow erase pulses are applied at each incrementally increased voltage level. If PASS remains false, PV is eventually increased until is rises to about PMAX resulting in a first narrow pulse at about PMAX (with corresponding pwell voltage shown at 613). Once PV reaches or otherwise exceeds PMAX as determined at step 513, operation continues to loop back to step 517 from step 513 in which narrow pulses at about the voltage level of PMAX are repeatedly applied until PASS becomes true as determined at step 507 or until the total pulse count value TPC reaches the maximum pulse count value MPC as determined at step 513. If PASS becomes true at any time during the erase process, operation advances to step 309 to begin the soft program procedure 306 as previously described. If PASS does not become true when the total pulse count becomes excessive (e.g., reaches MPC), then the error routine is performed at step 511 as previously described.

FIG. 6 is a timing diagram plotting the pwell voltage versus time during the erase procedure 304 according to the flowchart diagram of FIG. 5. The voltage of nwell of each of the memory cells 209 of the memory block is substantially similar to the pwell voltage, except that the nwell voltage does not return to 0V after each erase pulse (e.g., in one embodiment nwell returns to 3.3V between erases pulses during the erase verify test). Thus, the peak voltage levels and widths of the pwell pulses shown in FIG. 6 generally represent the erase ramp pulse voltage applied to the well connections of the memory cells 209 during the erase procedure (and are also indicative of the erase pulses in general applied to the memory cells 209). The initial two wide pwell pulses 601 and 603 are shown followed by a third pwell pulse 604. The voltage of the wide erase pulses continue to increase from an initial voltage value (shown as INIT) until the pwell pulse 605, which is shown having a voltage of just under WMAX. Once the pulse voltage reaches or exceeds WMAX, the width of the pulses are decreased and multiple pulses are asserted at each pulse voltage level. As shown, the first two narrow pwell pulses 607 and 609 are part of the first group of narrow pulses 610 having a voltage level just above WMAX. If PASS is not yet true after the first group of narrow pulses 610, then the voltage is increase for the second group of pulses 611. In the illustrated embodiment as previously described, the pulse width is decreased by a factor of four and each pulse group includes 4 pulses. In alternative embodiments, the narrow pulses may be narrower or wider and the number in each group may be more or less than four. The group size may even remain at one (no group, individual pulses) and SV may be adjusted (e.g., reduced) so that the voltage of the narrow pulses are incrementally increased in a similar manner as the wider pulses. For example, rather than group the narrow pulses into groups of four, the step voltage value SV may be reduced (by any amount, such as, for example, by the same NPC factor so that the voltage of the narrow pulses increase at a relatively constant rate). For example, although not specifically shown, the step voltage value SV may be initially set to a first incremental step voltage (e.g., 140 mV) until PV reaches or exceeds the intermediate voltage WMAX, and then reduced so a second incremental step voltage (e.g., less the 140 mV) once WMAX is reached. It is noted that in the illustrated embodiment, the erase verify test is performed and PASS is evaluated after each individual pulse (wide or narrow) and the erase pulses are completed at that time. Operation continues in this manner until PASS becomes true or until the voltage of the erase pulses reaches or exceeds PMAX as shown by a pulse at about PMAX. Once PMAX is reached, the voltage of the pulses is no longer increased and the pulses are repeatedly asserted at the same voltage level until the maximum pulse count (MPC) is reached or until PASS becomes true.

It is possible that PASS becomes true during application of the wider and lower voltage erase pulses up to the pwell pulse 605 having a voltage just below WMAX. If the erase verify test is not met for the wide pulses, then the narrower pulses are applied at successively increasing voltage levels (or ramped voltage) up to the maximum pulse voltage level PMAX. It is likely that PASS becomes true indicating that the erase verify test is met during application of the narrower pulses. In conventional configurations, wider erase pulses of increasing voltage level up to the maximum pulse voltage are repeatedly applied until the erase verify test is met, resulting in significant over erase of the memory cells of the memory block 202 as shown by curve 403 of FIG. 4. Instead, the modified FN erase procedure begins to apply narrower pulses at a lower erase voltage level WMAX so that the higher voltage erase pulses are narrower and thus shorter in duration. The result is that substantially less memory cells become over erased as shown by curve 407 of FIG. 4.

The modified FN erase procedure as described herein may take longer than the conventional FN erase procedure since the conventional operation applies wider pulses at similar voltage levels resulting in greater erase pulse energy ultimately applied to the memory cells. At least one benefit of the modified FN erase procedure, however, is that the total time of the subsequent soft program procedure 306 is substantially reduced because the number of over erased memory cells 209 is substantially reduced. In practice, the total overall erase time using the modified FN erase procedure is significantly reduced since the number of memory cells requiring soft programming is significantly reduced.

A method of erasing a memory block of a non-volatile memory, including setting a pulse width of erase pulses to an initial width, repeatedly applying erase pulses to the memory block until the memory block meets an erase metric or until a maximum number of erase pulses have been applied, during the repeatedly applying erase pulses to the memory block, gradually adjusting a pulse voltage magnitude of the erase pulses from an initial pulse voltage level to a maximum pulse voltage level, and during the repeatedly applying erase pulses to the memory block, reducing the width of the erase pulses to less than the initial width when the pulse voltage magnitude reaches an intermediate voltage level between the initial pulse voltage level and the maximum pulse voltage level.

The method may include performing an erase verify test after application of each erase pulse to determine whether the memory block has met the erase metric. The method may include determining whether each memory cell of the memory block has a threshold voltage which is no more than an erase verify voltage level to determine whether the memory block has met the erase metric after application of each erase pulse. The method may include adjusting the pulse voltage magnitude by an incremental step voltage after application of each erase pulse while the pulse voltage magnitude is less than the intermediate voltage level, and adjusting the pulse voltage magnitude by an incremental step voltage after application of a step pulse count limit number of more than one erase pulse while the pulse voltage magnitude is at least the intermediate voltage level. The method may include adjusting the pulse voltage magnitude by a first incremental step voltage after application of each erase pulse while the pulse voltage magnitude is less than the intermediate voltage level, and adjusting the pulse voltage magnitude by a second incremental step voltage after application of at least one erase pulse while the pulse voltage magnitude is at least the intermediate voltage level, where the second incremental step voltage is less than the first incremental step voltage.

A method of erasing a memory block of a non-volatile memory may include preprogramming the memory block, erasing the memory block after preprogramming, and soft programming any memory cells of the memory block which have been over-erased. Erasing the memory block may include setting a pulse width of erase pulses to an initial width, repeatedly applying erase pulses to the memory block until the memory block meets an erase metric or until a maximum number of erase pulses have been applied, gradually adjusting a pulse voltage magnitude of the erase pulses from an initial pulse voltage level to a maximum pulse voltage level, and reducing the width of the erase pulses to less than the initial width when the pulse voltage magnitude reaches an intermediate voltage level between the initial pulse voltage level and the maximum pulse voltage level.

Determining whether the memory block is erased may include determining whether each memory cell of the memory block has a threshold voltage which is no greater than an erase verify voltage. The preprogramming the memory block may include applying at least one program pulse to each memory cell of the memory block which has a threshold voltage less than a program verify voltage until each memory cell has a threshold voltage of at least the program verify voltage. The soft programming may include applying at least one soft program pulse to each memory cell of the memory block which has a voltage less than a soft program verify voltage until each memory cell has a voltage of at least the soft program verify voltage.

A non-volatile memory according to one embodiment includes an array of memory cells and a memory control system. The memory control system repeatedly applies erase pulses to the memory cells until the memory cells meets an erase metric or until a maximum number of erase pulses have been applied. The memory control system incrementally increases a pulse voltage of the erase pulses from an initial pulse voltage to a maximum pulse voltage. The memory control system reduces a pulse width of the erase pulses from an initial pulse width to a narrow pulse width when the pulse voltage achieves an intermediate voltage level which is between the initial pulse voltage and the maximum pulse voltage.

The memory control system may incrementally increase an erase pulse voltage applied to at least one well connection of the memory cells. The memory control system may increase the pulse voltage of each one of the erase pulses by an incremental voltage until the pulse voltage achieves the intermediate voltage level, where the memory control system increases the pulse voltage by the incremental voltage after each group including a limit number of more than one erase pulse after the pulse voltage achieves the intermediate voltage level. The memory control system may determine the narrow pulse width by dividing the initial pulse width by the limit number. The memory control system may increase the pulse voltage of each one of the erase pulses by a first incremental voltage until the pulse voltage achieves the intermediate voltage level, where the memory control system increases the pulse voltage of each one of the erase pulses by a second incremental voltage after the pulse voltage achieves the intermediate voltage level, where the second incremental voltage is less than the first incremental voltage. The memory control system may preprogram the memory cells before applying the erase pulses, and may soft program over erased ones of the memory cells after the memory cells meet the erase metric.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A method of erasing a memory block of a non-volatile memory, comprising:
    setting a pulse width of erase pulses to an initial width;
    repeatedly applying erase pulses to the memory block until the memory block meets an erase metric or until a maximum number of erase pulses have been applied;
    during said repeatedly applying erase pulses to the memory block, gradually adjusting a pulse voltage magnitude of the erase pulses from an initial pulse voltage level to a maximum pulse voltage level; and
    during said repeatedly applying erase pulses to the memory block, reducing the width of the erase pulses to less than the initial width when the pulse voltage magnitude reaches an intermediate voltage level between the initial pulse voltage level and the maximum pulse voltage level.

2. The method of claim 1, further comprising performing an erase verify test after application of each erase pulse to determine whether the memory block has met the erase metric.

3. The method of claim 1, further comprising determining whether each memory cell of the memory block has a threshold voltage which is no more than an erase verify voltage level to determine whether the memory block has met the erase metric after application of each erase pulse.

4. The method of claim 1, wherein said gradually adjusting a pulse voltage magnitude of the erase pulses comprises:
    adjusting the pulse voltage magnitude by an incremental step voltage after application of each erase pulse while the pulse voltage magnitude is less than the intermediate voltage level; and
    adjusting the pulse voltage magnitude by the incremental step voltage after application of a step pulse count limit number of erase pulses while the pulse voltage magnitude is at least the intermediate voltage level, wherein the step pulse count limit number is greater than one.

5. The method of claim 4, wherein said reducing the width of the erase pulses comprises dividing the initial width by the step pulse count limit number.

6. The method of claim 1, wherein said gradually adjusting a pulse voltage magnitude of the erase pulses comprises:
    adjusting the pulse voltage magnitude by a first incremental step voltage after application of each erase pulse while the pulse voltage magnitude is less than the intermediate voltage level; and
    adjusting the pulse voltage magnitude by a second incremental step voltage after application of at least one erase pulse while the pulse voltage magnitude is at least the intermediate voltage level, wherein the second incremental step voltage is less than the first incremental step voltage.

7. A method of erasing a memory block of a non-volatile memory, comprising:
    preprogramming the memory block;
    erasing the memory block after said preprogramming, wherein said erasing comprises:
        setting a pulse width of erase pulses to an initial width;
        repeatedly applying erase pulses to the memory block until the memory block meets an erase metric or until a maximum number of erase pulses have been applied;
        during said repeatedly applying erase pulses to the memory block, gradually adjusting a pulse voltage magnitude of the erase pulses from an initial pulse voltage level to a maximum pulse voltage level; and
        during said repeatedly applying erase pulses to the memory block, reducing the width of the erase pulses to less than the initial width when the pulse voltage magnitude reaches an intermediate voltage level between the initial pulse voltage level and the maximum pulse voltage level; and
    when the memory block is erased, soft programming any memory cells of the memory block which have been over erased.

8. The method of claim 7, further comprising:
    setting a step pulse count limit number to an initial number which is at least one;
    increasing the step pulse count limit number when the pulse voltage magnitude reaches the intermediate voltage level; and
    wherein said repeatedly applying erase pulses comprises applying the step pulse count limit number of erase pulses at each pulse voltage magnitude.

9. The method of claim 8, wherein said reducing the width of the erase pulses comprises dividing the initial width by the step pulse count limit number.

10. The method of claim 7, wherein said gradually adjusting a pulse voltage magnitude comprises increasing the pulse voltage magnitude by an incremental step voltage, further comprising decreasing the incremental step voltage when the pulse voltage magnitude reaches the intermediate voltage level.

11. The method of claim 10, wherein said reducing the width of the erase pulses comprises narrowing pulse width by an integer number greater than one, and wherein said method further comprises dividing the incremental step voltage by the integer number when the pulse voltage magnitude reaches the intermediate voltage level.

12. The method of claim 7, wherein said preprogramming the memory block comprises applying at least one program pulse to each memory cell of the memory block which has a threshold voltage less than a program verify voltage until each memory cell has a threshold voltage of at least the program verify voltage.

13. The method of claim 7, wherein said determining whether the memory block is erased comprises determining whether each memory cell of the memory block has a threshold voltage which is no greater than an erase verify voltage.

14. The method of claim 7, wherein said soft programming comprises applying at least one soft program pulse to each memory cell of the memory block which has a threshold voltage less than a soft program verify voltage until each memory cell has a threshold voltage of at least the soft program verify voltage.

15. A non-volatile memory, comprising:
a plurality of memory cells; and
a memory control system which repeatedly applies erase pulses to said plurality of memory cells until said plurality of memory cells meets an erase metric or until a maximum number of erase pulses have been applied, wherein said memory control system incrementally increases a pulse voltage of said erase pulses from an initial pulse voltage to a maximum pulse voltage, and wherein said memory control system reduces a pulse width of said erase pulses from an initial pulse width to a narrow pulse width when said pulse voltage achieves an intermediate voltage level which is between said initial pulse voltage and said maximum pulse voltage.

16. The non-volatile memory of claim 15, wherein said memory control system incrementally increases an erase pulse voltage applied to at least one well connection of each of said plurality of memory cells.

17. The non-volatile memory of claim 15, wherein said memory control system increases said pulse voltage of each one of said erase pulses by an incremental voltage until said pulse voltage achieves said intermediate voltage level, and wherein said memory control system increases said pulse voltage by said incremental voltage after each group comprising a limit number of more than one erase pulse after said pulse voltage achieves said intermediate voltage level.

18. The non-volatile memory of claim 17, wherein said memory control system determines said narrow pulse width by dividing said initial pulse width by said limit number.

19. The non-volatile memory of claim 15, wherein said memory control system increases said pulse voltage of each one of said erase pulses by a first incremental voltage until said pulse voltage achieves said intermediate voltage level, wherein said memory control system increases said pulse voltage of each one of said erase pulses by a second incremental voltage after said pulse voltage achieves said intermediate voltage level, and wherein said second incremental voltage is less than said first incremental voltage.

20. The non-volatile memory of claim 15, wherein said memory control system preprograms said plurality of memory cells before applying said erase pulses, and wherein said memory control system soft programs over erased ones of said plurality of memory cells after said plurality of memory cells meets said erase metric.

* * * * *